United States Patent [19]
Doerrwaechter et al.

[11] Patent Number: 5,939,969
[45] Date of Patent: Aug. 17, 1999

[54] PREFORMED THERMAL FUSE

[75] Inventors: Bernhard E. Doerrwaechter, Oconomowoc; Keck C. Pathammavong, Waukesha; Kurt M. Krachenfels, West Allis, all of Wis.

[73] Assignee: Microelectronic Modules Corporation, New Berlin, Wis.

[21] Appl. No.: 08/920,916

[22] Filed: Aug. 29, 1997

[51] Int. Cl.$^6$ ........................ H01H 85/046; H01H 85/04
[52] U.S. Cl. .................. 337/297; 337/159; 337/232; 337/152
[58] Field of Search ...................... 337/297, 158, 337/268, 159, 290, 401, 413–416, 152, 232

[56] References Cited

U.S. PATENT DOCUMENTS

| | | | |
|---|---|---|---|
| 5,084,691 | 1/1992 | Lester et al. | 337/297 |
| 5,097,247 | 3/1992 | Doerrwaechter | 337/405 |
| 5,479,147 | 12/1995 | Montgomery | 337/297 |
| 5,552,757 | 9/1996 | Blecha et al. | 337/297 |

*Primary Examiner*—Leo P. Picard
*Assistant Examiner*—Anatoly Vortman
*Attorney, Agent, or Firm*—Reinhart, Boerner, Van Deuren, Norris & Rieselbach, s.c.

[57] ABSTRACT

A preformed thermal fuse comprising two electrodes, first and second layers of solder, and a conductive bridge comprising a non-paste solder material is disclosed. The conductive bridge has a melting temperature which is substantially equivalent to the predetermined actuation temperature of the fuse. The melting temperatures of the first and second layers of solder are selected to allow reflow soldering of the device.

14 Claims, 4 Drawing Sheets

PREFORMED THERMAL FUSE

BACKGROUND OF INVENTION

This invention relates generally to a heat actuated fuse and to an apparatus which incorporates such a fuse for protecting electrical circuitry. The invention is particularly useful for interrupting current flow to thick film circuits and components.

A heat actuated fuse has an important advantage over the more common current actuated fuse. Although both types of fuses ultimately open at a predetermined temperature, a heat actuated fuse can be positioned such that it responds directly to the temperature of a protected component or circuit, and temperature is often a better indicator of imminent failure than current. Examples of known heat actuated fuses are described in Great Britain Patent 2,145,295A and U.S. Pat. Nos. 4,533,896 and 5,097,247.

Great Britain Patent 2,145,295A discloses a thermal fuse disposed on a substrate nearby a resistor, which is also disposed on the substrate. The fuse includes a pair of electrodes defining a gap between them, a gold fuse link extending across the gap to electrically interconnect the electrodes, and a film of solder overlying the gold fuse link and overlapping at least one of the electrodes. When the temperature of the substrate exceeds the melting point of the solder film, the solder is intended to melt, dissolve the gold fuse link, and then retreat from the gap with the dissolved gold to sever the electrical connection between the electrodes.

This fuse is relatively simple to manufacture, but its reliability depends on thorough dissolution of the gold fuse link by the process of leaching. This is a gradual process which begins after the film of solder melts. The gold fuse link then dissolves and is attracted to tin in the solder. The speed of opening of this fuse is relatively slow, and the solder material is limited to a composition containing tin or whatever material will effectively leach the gold or other metal chosen for the fuse link.

U.S. Pat. No. 4,533,86 discloses a fuse for protecting thick film devices deposited on a substrate. The fuse includes two terminal clocks, each including a hole, which are mounted to the substrate in close proximity to each other and with the holes aligned. An electrically conductive fusible link (e.., solder) is suspended across a space between the terminal blocks and extends into the holes to complete an electrical circuit. The holes are larger than necessary to accept the fusible link so that, when the fusible link melts because of excessive heat, molten material from the fusible link will be drawn into the holes.

Manufacture of this fuse is a complicated and labor intensive process. Manufacture requires boring of holes in the terminal blocks, coating the inner surfaces of the holes and the end surfaces of the terminal blocks with solder, assembling the blocks and fusible link, and then positioning and soldering the assembled fuse onto electrodes provided on the substrate.

U.S. Pat. No. 5,097,247 discloses an arrangement of materials which function as a fuse and can be deposited on an electrically insulating substrate, using standard printed circuit fabrication techniques. First and second electrodes are disposed on the substrate, defining a gap therebetween. A layer of first solder paste material, having a melting temperature higher than the actuation temperature of the fuse as disclosed on at least one of the electrodes. A conductive link disposed on at least a portion of each electrode and on the substrate extends across the gap to provide an electrical connection between the electrodes. The conductive link is comprised of a second solder paste material which has a melting temperature substantially corresponding to the actuation temperature of the fuse.

The melting temperature of the second solder paste, however, necessitates an inert, nitrogen or otherwise non-oxidizing atmosphere during manufacture. Depending upon the circuit board to which the fuse is attached and how the board is processed, the paste may reflow and inadvertently open the fuse.

Accordingly, there are a number of problems and drawbacks to the present technology. There is a need for a fuse and/or a method of manufacture to meet the requirements described above, as well as others known to those skilled in the art.

SUMMARY OF THE INVENTION

It is an object of the invention to provide a heat actuated fuse which opens reliably and quickly, but not at process temperatures.

It is another object of the invention to provide such a fuse which can be manufactured simply to open within a wide range of temperatures.

It is yet another object of the invention top provide apparatus incorporating one or more of such fuses for protecting circuitry including one or more electrical elements.

It can also be an object of the present invention to provide a thermal fuse using a solder paste to tin an underlying metal pattern and/or to control the dimensional coverage of the paste and permit further screen printing.

It can also be an object of this invention to provide a thermal fuse prepared using a solder paste and a solder portion and/or chip using standard and/or modified thick film high bred printing technology.

It can also be an object of the present invention to provide a thermal fuse and/or method of preparing the same, such that circuit density is increased.

It can also be an object of the present invention to provide a thermal fuse and/or method of preparing the same, such that the thermal characteristics of the fuse are improved and the solder contact with the substrate is enhanced.

It can also be an object of the present invention to provide a thermal fuse having a preformed solder portion.

It can also be an object of the present invention to provide a method for preparing a thermal fuse without manual attachment of a solder wire and/or without a fluxing operation.

It can also be an object of the present invention to provide a method for preparing a thermal fuse using a removable solder to bond a second solder portion and/or chip to a substrate.

It will be understood by those skilled in the art that one or more aspects of this invention can meet certain objectives, while one or more other aspects can meet certain other objectives. Each objective may not apply equally, in all instances, to every aspect of the present invention. In this regard, the aforementioned objects—as well as those aspects and features which follow—can be viewed in the alternative with respect to any one aspect of the present invention.

Other objects, features and advantages of the present invention will be apparent from this summary and will be readily apparent to those skilled in the art having knowledge of thermal fuse and thick film technology. Other objects, features, benefits and advantages will be apparent from the above as taken into conjunction with the accompanying examples, figures, tables, data and all reasonable inferences to be drawn therefrom.

In accordance with the invention, a heat actuated fuse for opening at a predetermined temperature comprises an arrangement of materials which can be deposited on an electrically insulating substrate by commonly used printed circuit fabrication techniques. First and second electrodes of electrically conductive material are disposed on the substrate in a spaced relationship to define a gap between the electrodes. A layer of a first solder material, having a melting temperature, lower than that of a second attachment solder paste, is disposed on at least one of the electrodes. A conductive solder portion and/or chip is disposed on at least a portion of each electrode and on the substrate and extends across the gap to provide an electrical connection between the electrodes.

The conductive portion/chip comprises a predetermined preformed quantity of a second non-paste solder material, which is in contact with the first solder layers on the electrodes. This solder portion/chip and the material from which it is preformed has a melting temperature which substantially corresponds to the actuation temperature of the fuse.

Because different solder materials having a large range of respective melting temperatures are readily available, the fuse can be constructed to open at any temperature within a correspondingly large range. A quantity of flux-containing material can be disposed in contact with the conductive solder portion/chip to effect a rapid and reliable flow of the second solder material to the first and second electrodes, when the fuse is heated to its actuation temperature.

In another embodiment of the invention, a resistive device is disposed proximate the fuse for effecting heating of the fuse in response to an electrical current passed through the device. Various advantages can be achieved by utilizing such means, independent of the protected circuit element(s), for heating the fuse. For example, by electrically connecting and physically disposing the resistive device such that it is subjected to the same electrical and environmental conditions as the circuitry protected by the fuse, freedom is achieved in the placement of the circuit element(s). Also, types of circuits elements which cannot, without destruction, produce sufficient heat to melt the fusible portion/chip may be protected.

The non-paste solder portion/chip of this invention precludes the need for an inert, nitrogen or otherwise non-oxidizing atmosphere during manufacture. The higher melting point associated with such a solder material prevents opening the fuse during reflow of the circuit board associated therewith.

DESCRIPTION OF VARIOUS PREFERRED EMBODIMENTS

Figure 1:
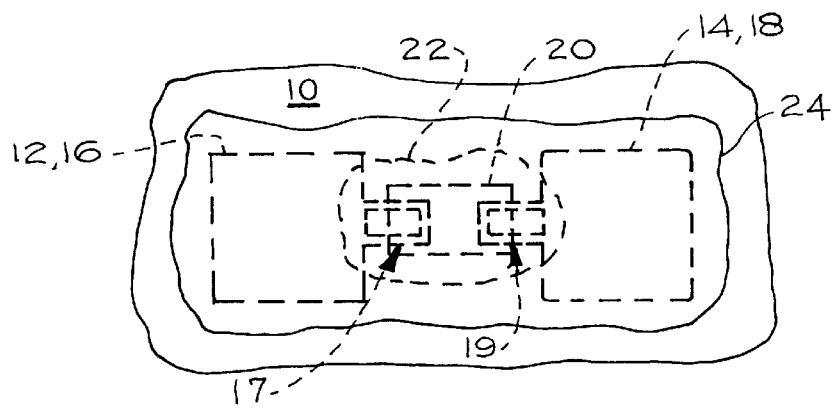
FIG. 1 is a top view of an embodiment of a heat actuated fuse in accordance with the invention, showing optionally a protective coating 24 over the non-paste solder portion/chip.
Figure 2A:
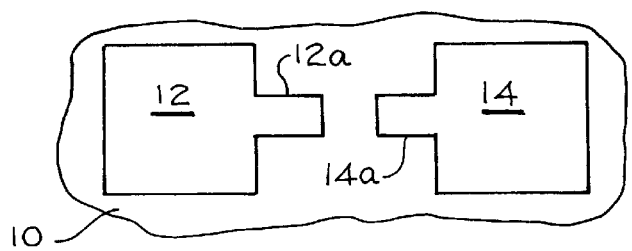
FIGS. 2a to 2h illustrate successive steps in manufacturing the fuse of FIG. 1.
Figure 2B:
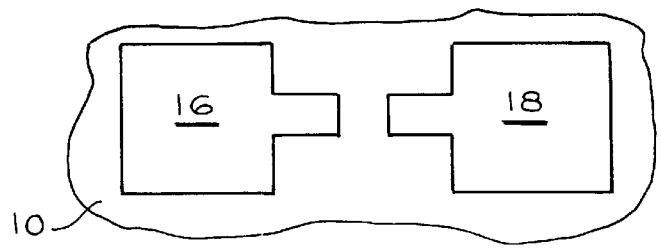
Figure 2C:
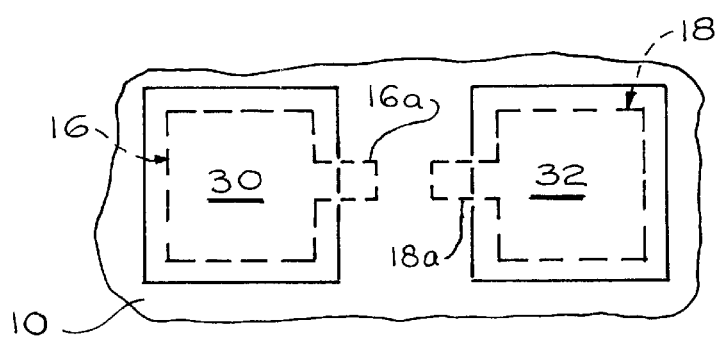
Figure 2D:
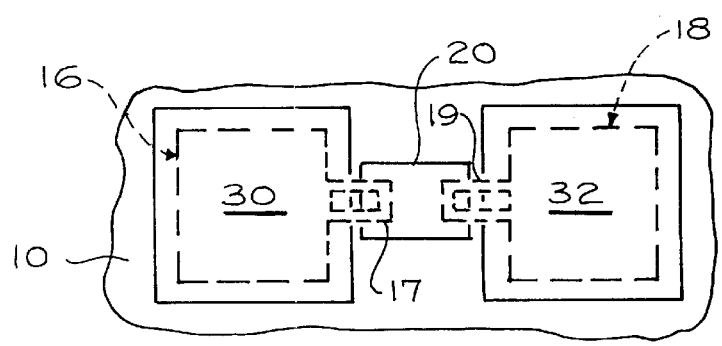
Figure 2E:
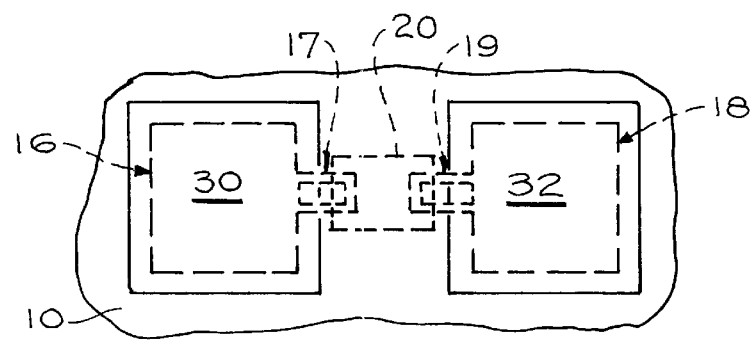
Figure 2F:
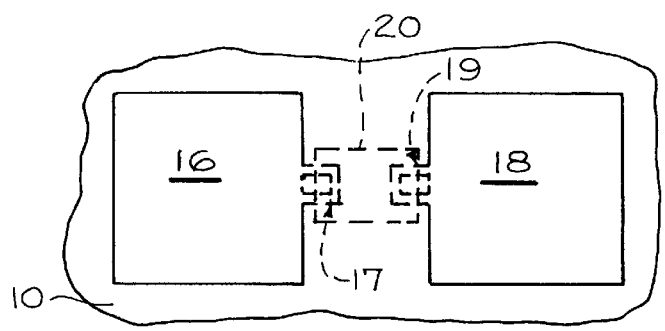
Figure 2G:
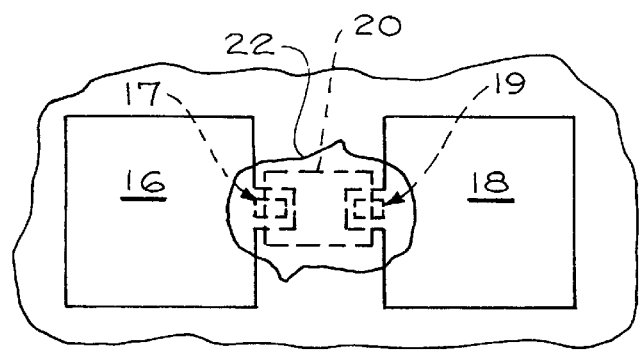
Figure 2H:
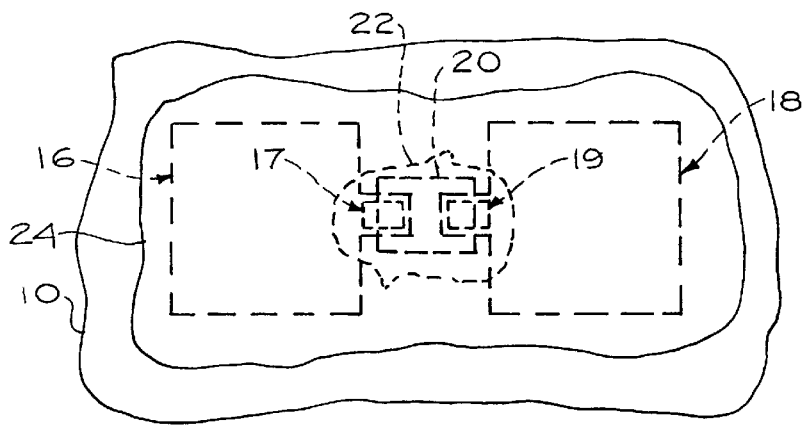

FIGS. 1 and 2 illustrate a preferred embodiment of a heat actuated fuse and the preparation thereof in accordance with the invention. The fuse is formed by a combination of deposits supported on a portion of a substrate 10 of an electrically insulating material. The particular substrate material must be compatible with the fuse fabrication method employed and must have heat conductivity characteristics compatible with the manner of actuating the fuse. For example, if the fuse and an actuating device are provided on the same substrate, and the fuse senses the temperature of the component primarily by means of heat conduction through the substrate, a material having substantial thermal conductivity, such as alumina, should be chosen. Alternatively, if lower heat conductivity is satisfactory for a particular application, a material such as a phenolic may be used.

Referring to FIG. 1, substrate 10 supports two thick film metallic electrodes 12 and 14 having respective projecting tab portions 12a and 14a, respectively. The metallic electrodes can be screen printed on substrate 10 and are preferably a palladium-silver alloy, and are spaced apart such that a gap of width w exists between the tab portions. The width w of the gap, irrespective of the presence of tab portions, determines the volume of solder which must flow onto the electrodes to open the fuse. In a practical embodiment of the fuse without tabs, each of electrodes 12 and 14 has a main portion measuring 0.100×0.100 in., and the gap has a width w of about 0.060 in. These dimensions may be adjusted from one embodiment to another to fit the fuse in the amount of available space.

Disposed on electrodes 12 and 14 are respective layers 16 and 18 of a first solder paste material having a melting temperature which is higher than the melting temperature of the second solder paste, described below. The melting temperature of this first paste is preferably lower than that of the solder portion/chip to avoid use of a non-oxidizing atmosphere during manufacture. The screen-printed solder covers substantially all of the base metal electrodes used to attach the fuse. The paste tins the metal and simultaneously controls thickness to permit additional screen-printing. For example, a 96.5Sn/3.5Ag solder having a melting temperature of 221° C., was used for a fuse having an actuation L temperature of 300° C. Layers 16 and 18 can have respective portions 16a and 18a, corresponding to tab portions 12a and 14a when present on the electrodes.

A conductive non-paste solder portion/chip 20 extends across the gap, electrically connecting the electrodes 12 and 14. The conductive portion/chip is disposed to cover the respective overlying solder portions 16 and 18. The non-paste solder portion/chip has a melting temperature substantially corresponding to the actuation temperature of the fuse. For example, a 10Sn/88Pb/2Ag solder chip having a melting temperature of about 300° C. can be used for a fuse having the same actuation temperature.

Optionally, a small quantity of flux-containing material 22 covers the solder portion/chip 20. Alternatively, this material may be disposed on the substrate immediately adjacent the link or as a dab on some substantial portion of the chip. The primary requirement is that the material 22 be in physical contact with the chip.

Suitable flux-containing materials include solder paste and simple flux itself. Either of these materials will, when the fuse link is heated to its melting temperature, promote the flow of the melted solder link 20 from the gap and onto the solder layers 16, 18 covering the electrodes 12, 14.

The size or volume of the solder portion forming the conductive chip 20 is determined by a combination of factors. For example, the chip should be containable on the electrodes 12 and 14 after melting of the solder. Also, the cross-sectional area of the conductive chip 20 should be sufficiently large to limit fuse resistance to whatever maximum value is allowable for the circuit in which the fuse is connected. Further, the length of the conductive chip 20 should be sufficient to extend across the gap between the electrodes and to make good electrical contact with the solder layers 16 and 18 and indirectly electrodes 12 and 14.

A protective covering 24 of a material such as latex or silicon rubber may be provided over at least the flux-containing material 22 to prevent damage to or deterioration of this material. When used, the protective covering should be of an electrically insulating material and should be flexible to facilitate flow of the solder chip 20 and the optional flux-containing material 22 onto the electrodes upon opening of the fuse. The protective covering shields the flux-containing material 22 from potentially damaging process steps performed subsequent to making of the fuse and provides protection against removal of the material 22 during handling. Covering 24 also contains the solder when it melts during opening of the fuse and ensures that the melted solder does not come into contact with other components that might be mounted on the substrate. Advantageously, the covering 24 may be provided over the entire exposed surface of the fuse, as is illustrated in FIG. 1.

The process steps involved in the manufacture of a typical heat actuated fuse in accordance with the invention is illustrated sequentially in FIGS. 2a–2h and described in the following corresponding paragraphs a–h:

a. A layer of palladium silver, thick film ink is screen printed on a 96% (by weight) suitably sized alumina substrate 10 and fired to form each of the electrodes 12 and 14 having a thickness of about 12 to 25 microns.

b. A layer of 96.5Sn/3.5Ag solder paste is screen printed over each of the electrodes and then heated to its melting temperature by infrared or other available means to form solder layers 16 and 18 having a thickness of about 75 to 150 microns. After these layers are formed, any flux residue is cleaned away by washing the substrate with a suitable solvent.

c. Layers 30 and 32 of solder resist material are screen printed over the tinned electrodes and their respective layers 16 and 18, except for substantial areas of the tab portions 16a and 18a. The resist material will prevent all but these areas of the tab portions of layers 16 and 18 from taking solder in the next step. The resist material should be cured at a sufficient temperature and over a suitable time.

d. A layer of a second solder paste (not shown) is screen printed over the areas of the tab portions 16a and 18a which are not covered with the solder resist material and over the adjacent area of the substrate. Generally, this paste is printed over an open area to be used for chip attachment. Type 62Sn/36Pb/2Ag solder paste (melting temperature of 179° C.) worked well in one embodiment of the fuse, as would any solder paste material having a melting/liquidus temperature lower than the first solder used to tin the electrodes. Non-paste (e.g., 10Sn/88Pb/2Ag) solder chip 20' is then placed between the tab portions.

e. The substrate with chip 20' is then reflowed at a temperature that allows the attachment (second) solder to reflow and bond the chip to substrate 10 without reflowing either the chip or the first tinning solder. The second/attachment solder reflows and is, to a certain extent, incorporated with the first solder, modifying the melting temperature of the first solder, but invariably leaving it less than that of portion/chip 20'.

f. Layers 16 and 18 are uncovered by removing the solder resist material printed in step c. The solder resist material is removed by cleaning. For example, the substrate can be washed with a suitable solvent (such as water) for the type of resist material used.

g. One or more drops of flux material 22 can be optionally deposited by a dispenser on the solder fuse chip 20'. The amount of flux material should be sufficient to contact a substantial area of the chip, and may cover the entire fuse link.

h. The protective layer 24 of latex or silicon rubber can be optionally deposited by a dispenser over the entire fuse and the surrounding surface area of the substrate 10 to a thickness of about 0.005 to 0.010 in.

Actual operation of the fuse is triggered when the substrate heats up to a temperature where the portion/chip becomes liquidus and reflows, opening the circuit.

Figure 3:
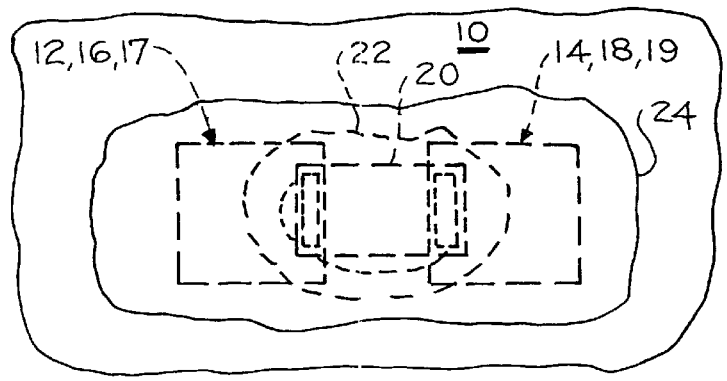
FIG. 3 is a top view of another embodiment of a heat actuated fuse in accordance with the invention.

FIG. 3 illustrates an alternative embodiment of a heat actuated fuse constructed in accordance with the invention. This embodiment is substantially identical to the embodiment of FIG. 1, except that electrodes 12 and 14 and the overlying solder layers 16 and 18 do not include tab portions. Rather, the non-paste portion/chip solder 20 bridging the gap between the electrodes is disposed on inwardly extending portions of the electrodes. A fuse of this type can be made to occupy less space than that of the FIG. 1 embodiment. However, less space will also be available for holding the melted solder link after actuation of the fuse.

Figure 4:
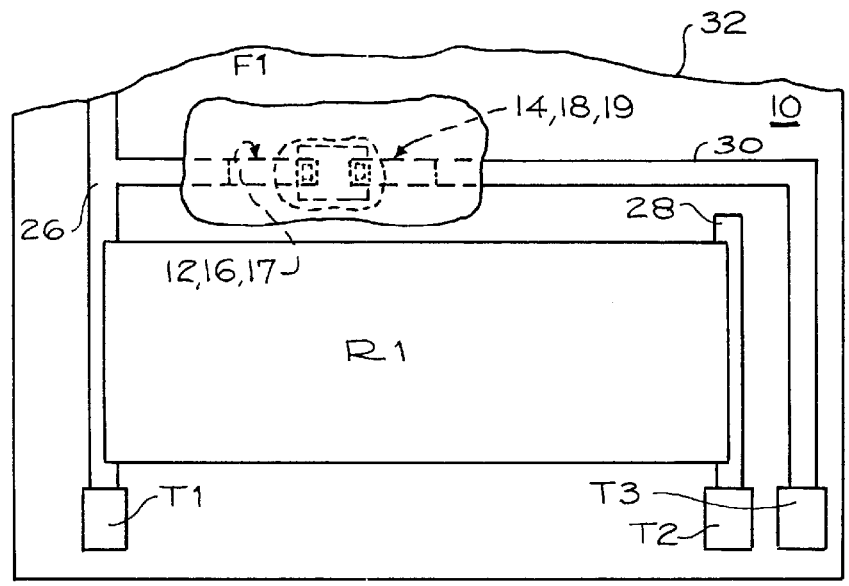
FIG. 4 is a top view of a circuit protection apparatus incorporating the fuse of FIG. 3.
Figure 5:
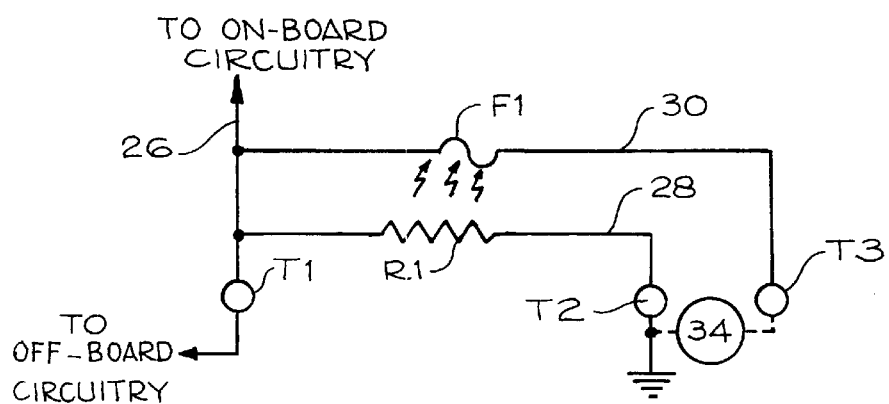
FIG. 5 is a schematic illustration of the circuit protection apparatus of FIG. 4.

FIGS. 4 and 5 illustrate a practical circuit protection apparatus in accordance with the invention. This apparatus comprises a circuit board including the substrate 10 supporting a heat actuated fuse F1 constructed in accordance with the invention, a thick film resistor R1, and conductive tracks 26, 28 and 30. In this illustrated embodiment, the substrate should be of a material having a substantial thermal conductivity, such as alumina. The resistor and conductive tracks are deposited on the substrate in accordance with conventional printed circuit fabrication techniques. Only a portion of the circuit board is illustrated in FIG. 4, and additional electrical elements such as circuit components and/or electrical terminals may be disposed on the remainder of the board located beyond the illustrated broken edge 32.

Conductive track 26 begins at an end thereof which is formed into an electrical terminal T1, and forms a conductive path connecting this terminal to one end of resistor R1 and to electrode 12 of fuse F1. Track 26 also forms a conductive path leading onto the non-illustrated portion of the circuit board for connection to one or more of the electrical elements disposed thereon. Similarly, conductive tracks 28 and 30 begin at respective ends thereof, forming terminal T2 and T3, and form conductive paths connecting these terminals to an opposite end of resistor R1 and to electrode 14 of fuse F1.

Manufacturing processes for connecting the conductive tracks 26 and 28 to respective ends of the resistor R1 are well known in the art. With regard to the process for connecting the conductive tracks 26 and 30 to the respective electrodes 12 and 14 of the fuse F1, this may be done conveniently by simultaneously forming these electrodes as integral extensions of the respective tracks. This is illustrated in FIG. 4, with solder layers 16, 18 being disposed on these integral extensions which form the electrodes 12, 14. Alternatively, these tracks and electrodes may be conductively joined by means such as a conductive epoxy, a wire connection, or by overlapping one conductive layer onto another.

By appropriately connecting the conductive track 26 and/or the terminals T1, T2 and/or T3 to other electrical elements, the protective circuit apparatus can be utilized in a variety of circuit configurations. For example, in a practical embodiment which is illustrated schematically in FIG. 5, terminal T1 is connected to circuitry located off the circuit board, conductive track 26 is connected to circuitry located on the circuit board, terminal T2 is connected to ground, and terminal T3 is connected to an electrical power source 34 such as a low voltage telephone line. Both the off-board circuitry and the on-board circuitry receive their electrical energy through fuse F1 from power source 34, and thus both will be protected against damage caused by over-voltage conditions which might occur at the power source.

In the illustrated embodiment of FIG. 5, the temperature of resistor R1 is determined primarily by the voltage applied across terminals T2 and T3 by the power source 34. The resistance of resistor R1 and its placement on the substrate 10 relative to heat actuated fuse F1 are predetermined to effect heating of the fuse to its actuation temperature at a specified power source over-voltage condition. If the fuse is actuated, the electrical connection of the off-board and on-board circuitry to terminal T3 will be permanently opened, but this circuitry can be reconnected to a power source by means of terminal T1 through a substitute protective apparatus.

The components and/or materials used in conjunction with the present invention are commercially available from sources well-known to those skilled in the art. For instance and without limitation: a substrate can be obtained from Coors Ceramics Company of Grand Junction, Colo.; a 10Sn/88Pb/2Ag solder alloy preform portion/chip can be obtained from Alpha Metals of Jersey City, N.J.; solder attachment paste can be obtained from Qualitek International, Inc. of Addison, Ill.; encapsulation material can be obtained from EMCA-Remex Products of Montgomeryville, Pa.; and thick film conductor can be obtained from DuPont Electronics of Research Triangle Park, N.C.

A variety of other embodiments of the protective circuit apparatus in accordance with the invention are also possible. For example, a plurality of the series connected resistor/fuse combinations illustrated in FIG. 4 may be disposed on a single substrate, with similar or dissimilar terminal and conductive track arrangements. Alternatively, the substrate may bear only one of such combinations, with no additional circuit elements being disposed on the substrate. As another alternative, the current passed through resistor R1 may be controlled by an independent circuit or sensory device, such as a circuit or device for sensing a critical physical or electrical characteristic of a protected circuit, motor etc.

EXAMPLES OF THE INVENTION

The following non-limiting examples and data illustrate the various aspects and features relating to the method and articles of this invention, including the surprising and unexpected results obtainable through use of a solder portion/chip in conjunction with the combination of solder pastes described above. The examples and data are illustrative and can be extended to include various embodiments within the scope of this invention.

Example 1

The data of this Example shows the utility of the present invention.

Test conditions:

25° C.

573 ma. applied to one resistor under test.

Fuse on pin 1 side tested first.

Fuse on pin 10 side tested after parts cooled down.

TABLE 1

| Test pc. | Time to open Fuse on | |
|---|---|---|
| Pin 1 side | | |
| 1 | 4 min. | Tested at 455 ma. |
| 2 | 5 min. | Did not open at 550 ma. |
| 3 | 37 sec. | 573 ma. |
| 4 | 41 sec. | 573 ma. |
| 5 | 38 sec. | 573 ma. |
| 6 | 34 sec. | 573 ma. |
| 7 | 33 sec. | 573 ma. |
| 8 | 32 sec. | |
| 9 | 22 sec. | |
| 10 | 25 sec. | |
| 11 | 5 min. | Did not open. Hole in RTV |
| 12 | 27 sec. | 573 ma. |
| 13 | 25 sec. | 573 ma. |
| Pin 10 side | | |
| 1. | open | Excessive heat from first test |
| 2. | 45 sec. | 573 ma. |
| 3. | 40 sec. | |
| 4. | 30 sec. | |
| 5. | 33 sec. | |
| 6. | 40 sec. | |
| 7. | 1:25 min. | |
| 8. | 1:05 min. | |
| 9. | 33 sec. | |
| 10. | 32. sec. | |
| 11. | 28 sec. | |
| 12. | open | |
| 13. | 1:00 min | |

Figure 6B:
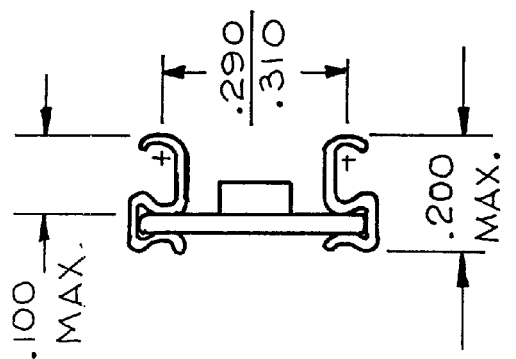
FIGS. 6a and 6b are schematic top and side views of a hybrid circuit component, showing a preferred solder chip fuse on the underside.
Figure 6A:
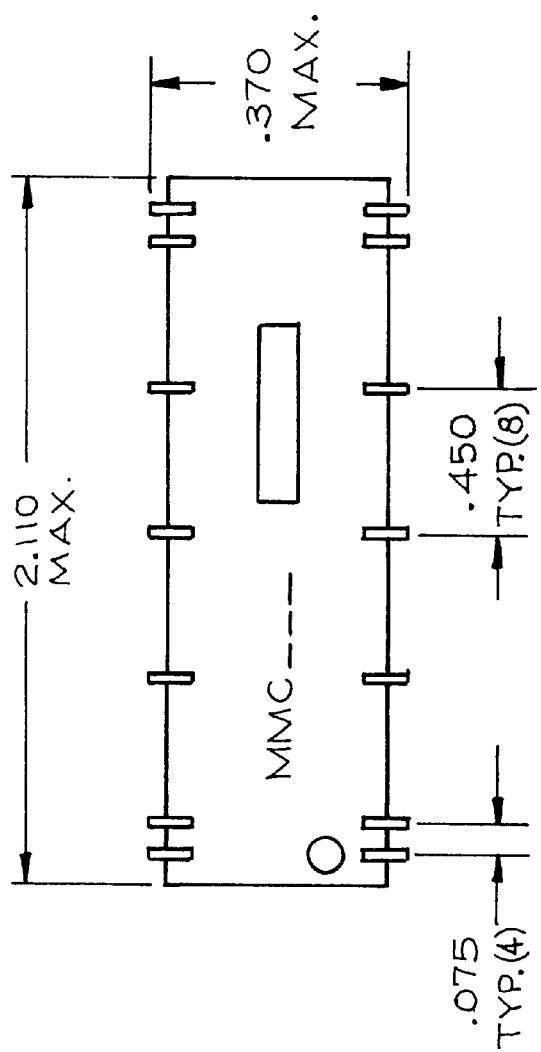

While the principles of this invention have been described in connection with specific embodiments, it should be understood clearly that these descriptions, along with the chosen figures, tables and data, are made only by way of example and are not intended to limit the scope of this invention, in any manner. For example, the non-paste solder portion/chip of this invention can be used in conjunction with a thermal fuse apparatus and applied to a variety of electronic circuitry, such as that schematically shown in FIG. 6. Other advantages and features of the invention will become apparent from the claims supported by this disclosure, with the scope thereof determined by the reasonable equivalents, as understood by those skilled in the art.

We claim:

1. An apparatus comprising a heat actuated fuse which opens at a predetermined actuation temperature, said fuse comprising:

an electrically insulating substrate;

first and second electrodes disposed on a surface of said substrate in a spaced apart relationship to define a gap there between, each of said electrodes comprising a layer of electrically conductive material;

a first layer of solder disposed on each of the first and second electrodes;

a second layer of solder disposed on at least a portion of each of the first and second electrodes; and a conductive link formed of a non-paste solder material having a melting temperature substantially corresponding to said predetermined actuation temperature extending across said gap and disposed on said portion of each of said first and second electrodes, wherein the second layer couples the conductive link to the electrodes.

2. The apparatus of claim 1 wherein said conductive link is a preformed chip.

3. The apparatus of claim 2 wherein said chip is a Sn/Pb/Ag solder alloy.

4. The application of claim 1 further including a flux material disposed in contact with at least a portion of said conductive link.

5. The apparatus of claim 4 further including a damage protective covering over at least said flux material.

6. The apparatus of claim 1 further including a resistive device positioned for effective heating of said fuse responsive to passage of an electric current through said resistive device.

7. The apparatus of claim 6 wherein said fuse and said resistive device are on the same substrate.

8. The apparatus of claim 7 wherein the resistive device is disposed proximate to said fuse.

9. The apparatus of claim 6 wherein said resistive device comprises a thick film resistor.

10. A heat actuated fuse for opening at a predetermined actuation temperature, said fuse compromising:

an electrically insulating substrate;

first and second electrodes disposed on a surface of said substrate in a spaced apart relationship to define a gap therebetween, each of said electrodes comprising a layer of electrically conductive material;

a layer of solder formed on each of the first and second electrodes;

a layer of a solder paste material disposed on at least a portion of each of the first and second electrodes, said solder paste having a melting temperature lower than both the melting temperature of the layer of solder and the predetermined actuation temperature of the fuse;

a conductive link extending across said gap and disposed on said portion of each of said first and second electrodes, said conductive link formed of a non-paste solder material having a melting temperature which substantially corresponds to said predetermined actuation temperature.

11. The fuse of claim 10 wherein said conductive link is a preformed chip.

12. The fuse of claim 11 wherein said chip is a Sn/Pb/Ag solder alloy.

13. The fuse of claim 10 further including a solder resist material disposed in contact with at least a portion of said first layer of solder.

14. The fuse of claim 13 further including a damage protective covering over at least said flux material.

* * * * *